(12) United States Patent
Mandlik et al.

(10) Patent No.: US 8,766,240 B2
(45) Date of Patent: Jul. 1, 2014

(54) PERMEATION BARRIER FOR ENCAPSULATION OF DEVICES AND SUBSTRATES

(75) Inventors: Prashant Mandlik, Lawrenceville, NJ (US); Jeffrey Silvernail, Yardley, PA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 11 days.

(21) Appl. No.: 12/886,994

(22) Filed: Sep. 21, 2010

(65) Prior Publication Data

US 2012/0068162 A1  Mar. 22, 2012

(51) Int. Cl.
*H01L 51/52* (2006.01)
*B32B 3/00* (2006.01)
*B32B 9/04* (2006.01)

(52) U.S. Cl.
USPC ........... 257/40; 257/72; 257/88; 257/100; 257/E51.018; 438/99; 438/151; 438/609

(58) Field of Classification Search
USPC .......... 257/40, 72, 88, 100, E51.018; 438/99, 438/151, 609
See application file for complete search history.

(56) References Cited

U.S. PATENT DOCUMENTS

| | | | |
|---|---|---|---|
| 5,654,084 A | 8/1997 | Egert | |
| 6,570,325 B2 * | 5/2003 | Graff et al. | 313/506 |
| 6,597,111 B2 * | 7/2003 | Silvernail et al. | 313/506 |
| 6,632,746 B2 * | 10/2003 | Kanegae et al. | 438/706 |
| 6,743,524 B2 | 6/2004 | Schaepkens | |
| 6,765,351 B2 * | 7/2004 | Forrest et al. | 313/506 |
| 6,767,641 B1 * | 7/2004 | Shimizu et al. | 428/446 |
| 6,911,354 B2 * | 6/2005 | Breen et al. | 438/99 |
| 7,015,640 B2 | 3/2006 | Schaepkens | |
| 7,075,103 B2 | 7/2006 | Yan et al. | |
| 7,510,913 B2 * | 3/2009 | Moro et al. | 438/124 |
| 2002/0168545 A1 | 11/2002 | Sawai et al. | |
| 2003/0104753 A1 | 6/2003 | Graff et al. | |
| 2005/0146267 A1 | 7/2005 | Lee et al. | |
| 2008/0074048 A1 * | 3/2008 | Jen et al. | 313/506 |
| 2008/0102223 A1 | 5/2008 | Wagner et al. | |
| 2008/0237181 A1 * | 10/2008 | Wagner et al. | 216/13 |

FOREIGN PATENT DOCUMENTS

| | | |
|---|---|---|
| KR | 10-2003-0008818 A | 1/2003 |
| WO | 2005051525 | 9/2005 |

OTHER PUBLICATIONS

Prashant Mandlik et al, "A single-layer permeation barrier for organic light-emitting displays", Applied Physics Letters, vol. 92, No. 10, p. 103309, 2008.
Prashant Mandlik et al, "Diffusion of atmospheric gases into barrier-layer sealed organic light emitting diodes", Applied Physics Letters, vol. 93, p. 203306, 2008.

(Continued)

*Primary Examiner* — Lex Malsawma
*Assistant Examiner* — Sheng Zhu
(74) *Attorney, Agent, or Firm* — Duane Morris LLP

(57) ABSTRACT

A permeation barrier film structure for organic electronic devices includes one or more bilayers having a hybrid permeation barrier composition. Each of the one or more bilayers includes a first region having a first composition corresponding to a first $CF_4$—$O_2$ Plasma Reactive Ion Etch Rate and a second region having a second composition corresponding to a second $CF_4$—$O_2$ Plasma Reactive Ion Etch Rate, wherein the second Etch Rate is greater than the first Etch Rate by a factor greater than 1.2 and the hybrid permeation barrier film is a homogeneous mixture of a polymeric material and a non-polymeric material, wherein the mixture is created from a single precursor material.

26 Claims, 6 Drawing Sheets

(56) References Cited

OTHER PUBLICATIONS

Lee, J.J. et al, "Enhanced nucleation density of chemical vapor deposition diamonds by using interlayer", Journal of Materials Research, vol. 12, No. 3, p. 657-664, Mar. 1997.

Tang, C.J. et al, "Influence of nucleation density on film quality, growth rate and morphology of thick CVD diamond films", Diamond and Related Materials, vol. 12, No. 9, pp. 1488-1495, 2003.

Yasuda, H. et al, "Polymerization of Organic Compounds in an Electrodeless Glow Discharge. X. Internal Stress in Plasma Polymers", Journal of Applied Polymer Science, vol. 21, 3179-3184, 1977.

Yu, Q.S. et al, "Internal Stress in Plasma Polymer Films Prepared by Cascade Arc Torch Polymerization", Journal of Polymer Science: Part A: Polymer Chemistry, vol. 37, pp. 1577-1587, 1999.

Gleskova, H. et al, "Mechanics of thin-film transistors and solar cells on flexible substrates", Solar Energy, vol. 80, pp. 687-693, 2006.

Cheng, I-Chun et al, "Stress control for overlay registration in a-Si:H TFTs on flexible organic-polymer-foil substrates", Journal of the SID, vol. 13/7, pp. 563-568, 2005.

Stoney, G. G. et al, "The Tension of Metallic Films Deposited by Electrolysis", Proc. R. Soc. London, vol. A 1909 82, pp. 172-175, 1909.

Suo, Z. et al, "Mechanics of rollable and foldable film-on-foil electronics", Applied Physics Letters, vol. 74, No. 8, pp. 1177-1179, 1999.

International Search Report and Written Opinion issued by the Korean Intellectual Property Office on Apr. 9, 2012 in connection with International Application No. PCT/US2011/051488 filed on Sep. 14, 2011.

Lin Han et al., "Properties of a Permeation Barrier Material Deposited from Hexamethyl Disiloxane and Oxygen," Journal of The Electrochemical Society, vol. 156, Issue 2, H106-H114.

* cited by examiner

PERMEATION BARRIER FOR ENCAPSULATION OF DEVICES AND SUBSTRATES

CROSS-REFERENCE TO RELATED APPLICATION

None.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present disclosure relates generally to permeation barrier coatings for electronic devices.

BACKGROUND

Organic electronic devices, such as organic light-emitting devices (OLEDs), are vulnerable to degradation when exposed to water vapor or oxygen. A protective barrier coating over the OLED to reduce its exposure to water vapor or oxygen could help to improve the lifetime and performance of the device. Films of silicon oxide, silicon nitride, or aluminum oxide, which have been successfully used in food packaging, have been considered for use as barrier coatings for OLEDs. However, these inorganic films tend to contain microscopic defects which allow some diffusion of water vapor and oxygen through the film. In some cases, the defects open as cracks in the brittle film. While this level of water and oxygen diffusion may be acceptable for food products, it is not acceptable for OLEDs. To address these problems, multilayer barrier coatings that use alternating inorganic and polymer layers have been tested on OLEDs and found to have improved resistance to water vapor and oxygen penetration. But these multilayer coatings have the disadvantages of complexity and cost. Thus, there is a need for improved barrier coatings suitable for use in protecting OLEDs.

SUMMARY

According to an aspect of the present disclosure, a permeation barrier film structure for organic electronic devices is disclosed. The permeation barrier film structure has a hybrid permeation barrier composition and comprises one or more bilayers. Each of the one or more bilayers comprises a first region having a first composition corresponding to a first $CF_4$—$O_2$ Plasma Reactive Ion Etch Rate and a second region having a second composition corresponding to a second $CF_4$—$O_2$ Plasma Reactive Ion Etch Rate, wherein the second $CF_4$—$O_2$ Plasma Reactive Ion Etch Rate is greater than the first $CF_4$—$O_2$ Plasma Reactive Ion Etch Rate by a factor greater than 1.2 and preferably between 1.2 to 5. In one embodiment, the hybrid permeation barrier film is a homogeneous mixture of a polymeric material and a non-polymeric material, wherein the mixture is created from one precursor material. The density of the first region is higher than that of the second region as illustrated by their plasma reactive ion etch rates.

According to another aspect of the present disclosure, each of the one or more bilayers comprises a first region having a $CF_4$—$O_2$ Plasma Reactive Ion Etch Rate less than 65 nm/min and a second region having a $CF_4$—$O_2$ Plasma Reactive Ion Etch Rate greater than 80 nm/min, where the $CF_4$—$O_2$ Plasma Reactive Ion Etch Rate is defined as the etch rate measured when etched using a $CF_4$—$O_2$ plasma reactive ion etch process which etches thermally grown $SiO_2$ at 45 nm/min. The ratio of the thickness of the second region to the first region can be between 0.5 to 20.

Figure 1:
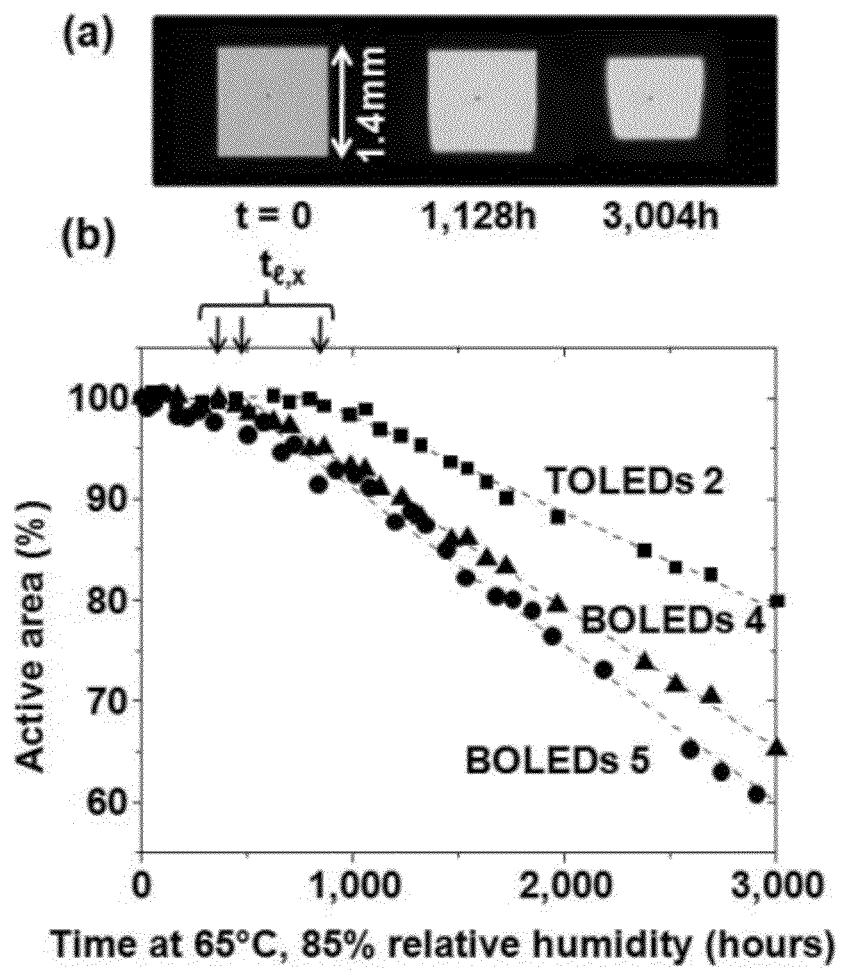
FIG. 1(a) shows photographs of the luminescent area of a pixel of a bottom-emitted OLED through an accelerated shelf-life testing illustrating the growth of a dark sheet caused by the permeation of moisture and oxygen along the interface of the device and the permeation barrier film.
FIG. 1(b) shows the average of the active areas of four pixels in barrier encapsulated transparent OLED (TOLED) and BOLED samples plotted against the time at accelerated shelf-life condition of 65° C. and 85% relative humidity.

The illustrations in the drawings are schematic only and the structures shown therein are not to scale.

DETAILED DESCRIPTION

In the following detailed description, examples of the preferred embodiments are set forth to illustrate the invention and are not intended to be limiting. Each of the disclosed aspects and embodiments may be considered individually or in combination with other aspects, embodiments, and variations of the invention. Modifications of the disclosed embodiments incorporating the spirit and substance of the invention may occur to persons of skilled in the art and such modifications are within the scope of the claimed invention.

The hybrid permeation barrier film of the present disclosure is a permeation barrier film having the hybrid composition of the hybrid permeation barrier film described in the co-pending U.S. patent application Ser. No. 11/931,939, published as US 2008/0237181 A1. The hybrid composition is referred to herein as the "hybrid permeation barrier composition." The hybrid permeation barrier composition is a homogeneous mixture of a polymeric material and a non-polymeric material, wherein the weight ratio of the polymeric to non-polymeric material is in the range of 95:5 to 5:95. The mixture is created from one precursor material as the source during the appropriate deposition process as described below. The disclosure of US 2008/0237181 A1 is incorporated herein by reference in its entirety.

As used herein the term "homogeneous," referring to the composition of the hybrid permeation barrier composition, means an intimate mixture of inorganic and polymer phases at molecular level wherein the composition is uniform throughout the bulk of the hybrid permeation barrier film. The term "non-polymeric" refers to a material made of molecules having a well-defined chemical formula with a single, well-defined molecular weight. A "non-polymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. Polymers include, but are not limited to homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" refers to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The term "mixture" is intended to include compositions having a single phase as well as compositions having multiple phases. Therefore, a "mixture" excludes subsequently deposited alternating polymeric and non-polymeric layers. Stated in another way, to be considered a "mixture," a layer should be deposited under the same reaction conditions and/or at the same time.

According to one embodiment, the hybrid permeation barrier layer can be formed by plasma enhanced chemical vapor deposition (PE-CVD) using a single source of precursor material. As used herein, "single source of precursor material" refers to a source that provides all the precursor materials that are necessary to form both the polymeric and non-polymeric materials when the precursor material is deposited by PE-CVD, with or without a reactant gas. This is intended to exclude methods where the polymeric material is formed using one precursor material, and the non-polymeric material is formed using a different precursor material. By using a single source of precursor material for both the polymeric and non-polymeric components of the barrier film, the deposition process is simplified. For example, a single source of precursor material will obviate the need for separate streams of precursor materials and the attendant need to supply and control the separate streams.

The precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO).

Although in some cases, CVD may be used for deposition of the hybrid permeation barrier layer, PE-CVD is desirable for various reasons, including low temperature deposition, uniform coating formation, and controllable process parameters. Various PE-CVD processes which are suitable for use in the present invention are known in the art, including those that use RF energy to generate the plasma.

The precursor material is a material that is capable of forming both a polymeric material and a non-polymeric material when deposited by chemical vapor deposition. Various such precursor materials are suitable for use in the present invention and are chosen for their various characteristics. For example, a precursor material may be chosen for its content of chemical elements, its stoichiometric ratios of the chemical elements, and/or the polymeric and non-polymeric materials that are formed under PE-CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by PE-CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen-containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organo-silicon compounds suitable for use as a precursor material include: hexamethyldisilazane; divinyltetramethyldisilizane; hexamethylcyclotrisilazane; dimethylbis(N-methylacetamido)silane; dimethylbis-(N-ethylacetamido)silane; methylvinylbis(N-methylacetamido)silane; methylvinylbis(N-butylacetamido)silane; methyltris(N-phenylacetamido) silane; vinyltris(N-ethylacetamido)silane; tetrakis(N-methylacetamido)silane; diphenylbis(diethylaminoxy) silane; methyltris(diethylaminoxy)silane; and bis (trimethylsilyl)carbodiimide.

When deposited by PE-CVD, the precursor material may form various types of polymeric materials in various amounts, depending upon the type of precursor material used, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

The precursor material may also form various types of non-polymeric materials in various amounts, depending upon the type of precursor material used, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, $SiO_2$, and mixed-valence oxides $SiO_x$. When deposited with a nitrogen-containing reactant gas, the non-polymeric material may include silicon nitrides ($Si_3N_4$). Other non-polymeric materials that may be formed include silicon oxycarbide and silicon oxynitrides.

The precursor material may be used in conjunction with a reactant gas that reacts with the precursor material in the PE-CVD process. The use of reactant gases in PE-CVD process is known in the art and various reactant gases are suitable, including oxygen-containing gases (e.g., $O_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

The inventors have determined that diffusion of moisture along the interface between the permeation barrier film and the surface of the underlying device is greater than diffusion of moisture through the bulk of the permeation barrier film material. Consequently, by providing a permeation barrier film that can slow down the diffusion of moisture along the permeation barrier/device interface, the inventors have found a way to significantly extend the shelf-life of OLEDs. The diffusion along the permeation barrier/device interface is also referred to herein as a "lateral interface diffusion." Also, the term "permeation" and "diffusion" is used interchangeably throughout this description.

FIG. 1(a) shows three photographs of the luminescent area of a pixel of bottom-emitted OLED (BOLED) illustrating the growth of a dark sheet expanding from the periphery towards the center of the pixel during an accelerated shelf-life testing. This is caused by the diffusion of moisture and oxygen along the permeation barrier film/device interface. The three photographs illustrate the luminescent or the active area of the BOLED at t=0, the beginning of the test, and after 1,128 hr and 3,004 hr in 65° C. and 85% relative humidity. A progressive reduction of the luminescent area of the pixel is observed. If the degradation is caused by bulk permeation across the thickness of the barrier film, multiple dark spots would generally appear in the luminescent area. That is not the case here and we see that the only dark spot which appears in the luminescent area grows very slowly and all the degradation is coming from the edge. The most plausible explanation for this is that the degradation is the result of permeation or lateral diffusion of moisture and oxygen along the interface of the barrier and the substrate. The small dark spot near the center of the pixel is a defect in the initial OLED that is sealed by the barrier layer and did not grow during the duration of the accelerated test. This illustrates that permeation of moisture and oxygen through the bulk of the permeation barrier film is sufficiently low and the barrier film sufficiently protects the pixel from possible deleterious effects of diffusion of moisture and oxygen through the bulk of the permeation barrier film.

In FIG. 1(b), the average of the active areas of each of the four pixels in barrier encapsulated transparent OLED (TOLED) and BOLED samples (one TOLED and two BOLEDs) are plotted against the time at accelerated shelf-life condition of 65° C. and 85% relative humidity. The notation "$t_{e,x}$" in FIG. 1(b) refers to the lag time, which is the time required for the moisture to permeate along the interface between the barrier and the substrate to reach the active area of the device. Before the moisture reaches the edges of the device, travelling along the interface, the active area of the device remains close to 100% of the original size. Once the moisture reaches the active area in the device, the shrinkage in the active area starts. From the results shown in FIGS. 1(a) and 1(b), we conclude that there is no bulk permeation through the barrier film for almost one year of storage at 65° C. and 85% relative humidity.

The inventors have previously confirmed that OLEDs encapsulated with silicon oxide-silicone polymer based hybrid permeation barrier film have shown a shelf-life of more than 7,500 hrs at 65° C. and 85% relative humidity. P. Mandlik, et al., "A single-layer permeation barrier for organic light-emitting displays", *Applied Physics Letters, vol.* 92, no. 10, p. 103309, 2008. We have determined that the degradation of OLEDs encapsulated with the hybrid permeation barrier occurs via lateral diffusion of moisture and oxygen along the interface of the permeation barrier with the OLED substrate. This interface has a polymeric character with a diffusion coefficient for moisture equal to $10^{-8}$ to $10^{-7}$ $cm^2/s$ at 65° C. and 85% relative humidity, which is close to the diffusion coefficient of moisture in Silicone polymer. Similar calculations for permeation of moisture through the bulk of the hybrid permeation barrier film give a value of diffusion coefficient of $10^{-15}$ $cm^2/s$ or less, corresponding to an estimated water vapor transmission rate (WVTR) of $10^{-6}$ $g/(m^2 \cdot day)$ or less. Thus, permeation of moisture and oxygen along the interface is faster than permeation through the bulk of the hybrid permeation barrier film material. The mechanisms of permeation and the calculations of various diffusion coefficients are described in the article by P. Mandlik, et al., "Diffusion of atmospheric gases into barrier-layer sealed organic light emitting diodes", *Applied Physics Letters, vol.* 93, 203306, 2008.

When the OLEDs can last more than 7,500 hrs of accelerated shelf-life testing with about 8 orders of magnitude difference between the diffusion coefficients of moisture along the interface and the bulk, if the permeation barrier film were to have very high density from the start of the deposition so that the interface permeation is minimized, the lifetime of OLEDs would increase tremendously. Even a couple orders of magnitude reduction in the moisture diffusion coefficient along the interface would make the OLEDs last for years in ambient conditions (i.e. non-accelerated shelf-life condition).

According to this disclosure, the inventors have found a way to increase the density of the permeation barrier film in the region near the interface between the permeation barrier film and the underlying surface in contact with the permeation barrier film, i.e. the surface of the OLED device or the substrate. This can be achieved by reducing the growth rate of the permeation barrier film during deposition of the initial portion or region of the permeation barrier film that is in contact with the underlying surface. Lower growth rate leads to increased nucleation density at the start of the permeation barrier film deposition process and, in turn, the increased nucleation density results in the growth of lower porosity, higher density film.

Figure 2:
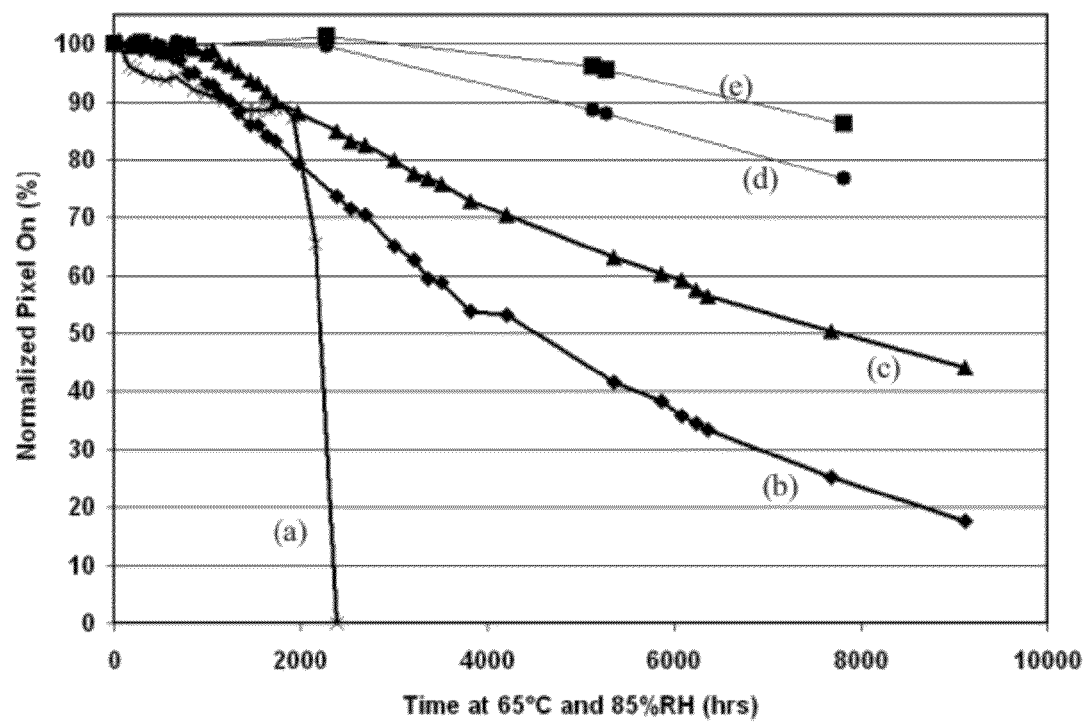
FIG. 2 shows a plot of the results of an accelerated shelf-life tests on encapsulated OLED samples conducted at 65° C. and 85% relative humidity.

FIG. 2 shows a plot of the results of accelerated shelf-life tests on encapsulated OLED samples (a), (b), (c), (d) and (e). The % of OLED pixels that remain turned on is plotted as a function of the number of hours exposed to the accelerated shelf-life condition of 65° C. at 85% relative humidity. The different barrier film deposition processes used for the test samples are shown in Table 1 below.

TABLE 1

Barrier film deposition process conditions for the samples shown in FIG. 2.

| Sample | Substrate | Encapsulation | HMDSO/O$_2$ gas ratio (sccm/sccm) | Growth rate (Å/sec) | Film Thickness (nm) | BOB Etch Rate (nm/min) |
|---|---|---|---|---|---|---|
| (a) | BOLED | Glass | — | — | — | — |
| (b) | BOLED | Hybrid barrier | 1.5/50 | 7.5 | 6 | 120 |
| (c) | TOLED | Hybrid barrier | 1.5/50 | 7.5 | 6 | 120 |
| (d) | BOLED | Hybrid barrier | 1.4/42 | 3.6 | 5.5 | NA |
| (e) | BOLED | Hybrid barrier | 1.25/33 | 2.4 | 4 | 100 |

Sample (a) is a control sample and is a BOLED substrate encapsulated with glass. Samples (b) and (c) are BOLED and TOLED substrates, respectively, and are encapsulated with the hybrid permeation barrier film deposited at a high growth rate of 7.5 Å/sec and intermittent depositions to produce lower density barrier film. In order to prevent the OLED from getting thermally damaged during the deposition process, the deposition is stopped for a certain interval to let the device cool down. This process is referred to as an intermittent deposition. Samples (d) and (e) are BOLED substrates encapsulated with the hybrid permeation barrier film deposited at a lower growth rates of 3.6 and 2.4 Å/sec, respectively, and longer, continuous depositions to produce higher density barrier films.

The samples listed in Table 1 were etched using 10:1 buffered oxide etch (BOE) to understand their relative densities. The BOE etch rates are provided in Table 1. 10:1 BOE is a wet chemical method to etch inorganic films. It uses 10% solution of HF in de-ionized water with NH$_4$F to maintain the pH value. A higher etch rate would indicate that the sample has a lower density than the sample with a lower etch rate. The samples listed in Table 1 are characterized with BOE rates rather than the CF$_4$—O$_2$ Plasma Reactive Ion Etch Rates because only BOE rates were available to the inventors. However, the relationship between the film samples based on their comparative densities reflected by the BOE rates would be the same if the CF$_4$—O$_2$ Plasma Reactive Ion Etch Rates were available.

As seen in the plot of FIG. 2, the control sample (a) degraded quickly after ~2,000 hrs by losing all pixels because of the saturation of the desiccant getter used in the glass encapsulation. Samples (b) and (c) performed better than the glass encapsulated control (a) but still suffered degradation caused by the lateral interface diffusion. The samples were visually inspected for the active area degradation. In contrast, the higher density barrier film samples (d) and (e) performed much better than the samples (b) and (c). This increase in lifetime for lower growth rate, higher density, samples (d) and (e) corresponds to the reduction in the interface diffusion of moisture and oxygen by a factor of 2 to 6. This is obtained from measuring the lag time for these samples. The lag time is inversely proportional to the diffusion coefficient. The lag time for the OLEDs encapsulated with low growth rate films comes out be 2 to 6 times less than that obtained for the OLEDs encapsulated with high growth rate films. The relationship between lag time and diffusion coefficient is explained in P. Mandlik, et al., "Diffusion of atmospheric gases into barrier-layer sealed organic light emitting diodes", *Applied Physics Letters*, vol. 93, 203306, 2008.

Above test results show that the shelf-life of OLEDs is extended when encapsulated with the higher density hybrid permeation barrier. Above results show that the density of the permeation barrier and hence the shelf-life of OLEDs encapsulated with the hybrid permeation barrier can be increased by changing the deposition conditions for the hybrid permeation barrier film, particularly the growth rate of the barrier film during deposition.

For thin films that grow via nucleation and growth mechanism, in order to form a coherent and continuous layer of film having a thickness d, the nucleation density at the start of the deposition process must be $N_d \sim 1/d^2$. That means for a nucleation density of $10^{10}/cm^2$, the film would become continuous when it reaches a thickness of 100 nm. Before becoming a continuous layer, the film remains porous and hence permeable which is not desirable for a permeation barrier. By increasing the nucleation density of the deposition process, continuous film can be achieved at a thinner film thickness. With slower growth rate of the hybrid permeation barrier film, the nucleation density increases and the film becomes continuous earlier than a faster growth rate film, as a result of which the interface diffusion slows down. The film becomes continuous and coherent when all the growing nuclei coalesce and form a dense film. Before this stage, there is invariably some porosity between various nuclei, which would facilitate permeation. This means that when the growing film becomes continuous sooner, the extent of this porous portion of the film is smaller and the barrier for permeation would be higher.

FIG. 2 shows that the sample (c) has a longer shelf life than the sample (b). The difference appears to be attributable to the cathode material of the OLEDs. The hybrid permeation barrier film was deposited on both OLED samples (b) and (c) together under the same conditions with the only difference being that in sample (b), the cathode is evaporated aluminum, whereas, the cathode in sample (c) is evaporated calcium followed by sputtered indium zinc oxide (IZO). It is known that depositing a sputtered film before growing diamond-like films via chemical vapor deposition (CVD) increases the nucleation density of the CVD diamond-like films. Thus, one can surmise that the nucleation density of the hybrid permeation barrier film is higher when deposited over the sputtered IZO compared to when deposited over the evaporated aluminum. Then, the lateral interface diffusion of moisture and oxygen in the OLED sample (c) with sputtered IZO cathode under the hybrid permeation barrier would be slower than that in the OLED sample (b) with evaporated aluminum cathode under the hybrid permeation barrier.

In addition to the effect of film growth rate and the provision of sputtered cathode layer under the hybrid permeation barrier film, there are other parameters that can help increase the nucleation density during the permeation barrier film deposition and hence minimize the lateral interface diffusion of moisture and oxygen. Some examples are increasing the substrate surface temperature, application of voltage bias, or preconditioning the substrate by electron or ion bombardment before the growth of the actual film.

Increasing the substrate temperature provides more kinetic energy to the activated species, increasing the probability of desorption of the molecules responsible for growth of the thin film, reducing the growth rate, thereby helping in increasing the film density. Higher substrate temperature also provides the growth species with ample energy to move on the surface of the substrate before aiding in the film growth. This surface motion facilitates multiple nucleation sites, again increasing film density. Applying bias voltage increases the energy with which the incoming ions impinge themselves on the growing film on the substrate. This wedging process increases the film density also. Preconditioning of the substrate surface by bombardment with electrons or ions increases the surface roughness on atomic scale, thereby providing more number of nucleation sites, hence helping in increasing the film density. In order to test the hybrid permeation barrier films we encapsulated bottom emission and transparent OLEDs (BOLEDs and TOLEDs) with the hybrid permeation barrier layer. BOLEDs have thick aluminum cathode and TOLEDs have thin MgAg cathode. Table 3 below describes the films deposited on the two types of OLEDs.

TABLE 3

Film deposited on BOLED and TOLED.

| Substrate | | High density film (nm) | High growth rate film (nm) (low density) | Bilayer stack thickness (nm) | Total barrier film thickness (nm) |
|---|---|---|---|---|---|
| BOLED | first bilayer stack | 270 | 400 | ×1 = 670 | =4990 |
| | subsequent 6 bilayer stacks | 120 | 600 | ×6 = 4320 | |
| TOLED | first bilayer stack | 210 | 220 | ×1 = 430 | =6930 |
| | subsequent 13 bilayer stacks | 90 | 410 | ×13 = 6500 | |

The film growth on the BOLED consists of deposition of first stack with 270 nm of high density film followed by 400 nm of high growth rate film. The system is then allowed to cool down. The remaining 6 stacks grown on top of the first stack consist of 120 nm of high density film and 600 nm of high growth rate film with cool down intervals in between. Similar process was used for the TOLED except in the TOLED sample, thirteen bilayer stacks were deposited on top of the first bilayer stack.

Figure 3:
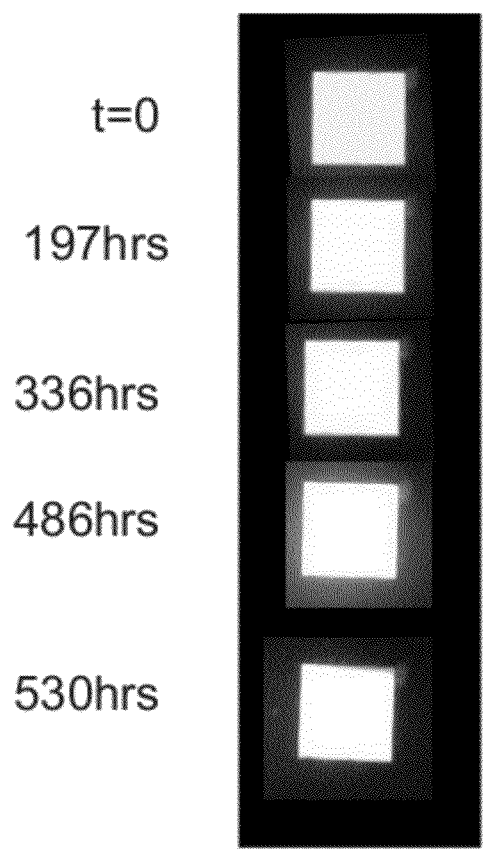
FIG. 3 shows a series of photographs of the active area of a BOLED taken at various times during the duration of an accelerated shelf-life test conducted at 85° C. and 85% relative humidity.
Figure 4:
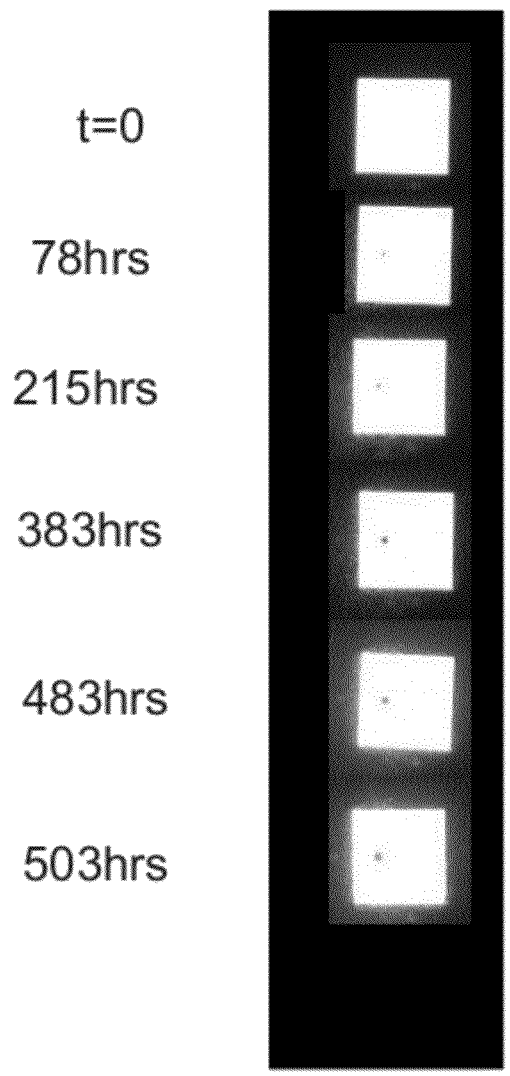
FIG. 4 shows a series of photographs of the active area of a TOLED taken at various times during the duration of an accelerated shelf-life test conducted at 85° C. and 85% relative humidity.

FIG. 3 and FIG. 4 show a series of photographs of the encapsulated BOLED and TOLED of Table 3, taken at intervals during the duration of the temperature-humidity test at 85° C. and 85% relative humidity. The devices were stored in the temperature-humidity chamber and were taken out for luminance measurements. The active areas of both devices are close to 100% after 500 hrs of storage at these conditions satisfying the most stringent shelf-lifetime requirements for OLEDs accepted by the industry currently.

When two dissimilar materials are placed in intimate contact with one another, such contact may give rise to stresses, particularly at the interface between the two materials. Thus, in certain embodiments, the residual internal stress of the hybrid permeation barrier layer may be controlled to reduce the incidence of stress-induced defects in the hybrid permeation barrier layer, such as cracking, voids, buckling, or delamination. One way to control the internal stress in the hybrid permeation barrier layer is to adjust the deposition conditions.

A precise control of internal stress is an important factor in the deposition of barrier films on OLEDs made on glass, steel foil or plastic substrates. Excessive tensile stress may fracture the barrier film and the underlying device, whereas excessive compressive stress may lead to buckling delamination. The total mismatched stress in thin films deposited by PE-CVD results from primarily three factors, (1) the disordered structure of the films (explained in next paragraph); (2) the difference in the thermal expansion coefficients (CTE) between the film and the substrate, and (3) the difference in the humidity expansion coefficients (CHE) between the film and the substrate. The mismatched stress generates a mismatched strain between the thin film and the substrate. The primary components of the mismatched strain ($\epsilon_M$) are (1) built-in strain ($\epsilon_{bi}$), (2) thermal strain ($\epsilon_{th}$), and (3) humidity strain ($\epsilon_h$), $$\epsilon_M = \epsilon_{bi} + \epsilon_{th} + \epsilon_h \quad (1)$$

The built-in strain ($\epsilon_{bi}$) depends on the material system and the deposition conditions. In PE-CVD, the reactive species get inserted in to the film continuously. This process can be viewed as a wedging process. The built-in strain depends on the frequency and the size of the inserting species. Both these factors are determined by the process conditions. The thermal strain ($\epsilon_{th}$) develops when the film is deposited at an elevated temperature and then is brought down to the room temperature. The thermal strain ($\epsilon_{th}$) is given by, $$\epsilon_{th} = (\alpha_f - \alpha_s) \times (T_{dep} - T_{room}) \quad (2)$$

where $\alpha_f$ and $\alpha_s$ are the CTEs of the film and the substrate. The humidity strain ($\epsilon_h$) is given by, $$\epsilon_h = -(\beta_f - \beta_s) \times \% \text{ RH}, \quad (3)$$

where $\beta_f$ and $\beta_s$ are the CHEs of the film and the substrate and % RH is the relative humidity.

In response to the mismatched strain, the film-on-substrate structure deforms. The deformation of the structure depends on the Young's modulus (Y) and thickness (d) of the film and the substrate. The product of the Young's modulus and the thickness (Y·d) decides the relative mechanical strengths of the film and the substrate. When $Y_s \cdot d_s >> Y_f \cdot d_f$, the substrate dominates and the film complies. This is the case when thin films are deposited on stiff substrates like glass or Si. As a result, biaxial stress arises in the film causing the structure to bend in the form of a spherical cap with large radius of curvature (R) which can be described by the Stoney equation (Eq. 4)

$$R = \frac{Y_s^* d_s^2}{6\varepsilon_M Y_f^* d_f}$$

(4)

where $Y^*_s$ and $Y^*_f$ are the biaxial elastic moduli $$\left(\frac{Y}{1-v}\right)$$

of substrate and film. The radius of curvature (R) is considered positive when the film faces inward, i.e., the film is under tensile strain and negative when the film is under compressive strain.

When the film and the substrate have comparable strengths, i.e., $Y_s \cdot d_s \approx Y_f \cdot d_f$, the simple Stoney equation does not apply. In this case the structure bends into a cylindrical roll whose radius of curvature, R is given by a very complicated expression, but for similar Poisson ratios for the substrate and the film it can be approximated by the Stoney equation (Eq. 5), $$\frac{1}{R} = \frac{6\varepsilon_M(1+v)\overline{Y}_f \overline{Y}_s d_f d_s (d_f + d_s)}{(\overline{Y}_s d_s^2 - \overline{Y}_f d_f^2)^2 + 4\overline{Y}_f \overline{Y}_s d_f d_s (d_f + d_s)^2} \quad (5)$$

In (Eq. 5), $$\left(\frac{1}{R}\right)$$

is the change in the curvature $$\left(\kappa \equiv \frac{1}{R}\right).$$

The Young's modulus for the hybrid permeation barrier film is ~67.5 GPa and that of DuPont™ Kapton® 200E polyimide substrate is ~5.3 GPa. The thickness of the substrate is ~50 μm. Hence for barrier film thickness of ~1 μm, the mechanical strengths of film and substrate are comparable. Similar Poisson ratios enable the use of the Stoney equation (Eq. 5).

The built-in stress of the barrier film can be calculated by rearranging the Stoney equation (Eq. 5) and using it to calculate stress instead of strain. The modified equation provides the built-in stress as, $$\sigma_i = \frac{\overline{Y}_s d_s^2}{6(1-v_s)d_f}\left(1 + \frac{d_f}{d_s}\left(4\frac{\overline{Y}_f}{\overline{Y}_s} - 1\right)\right)\left(\frac{1}{R}\right) \quad (6)$$

Built-in stress and hence built-in strain in these films can be changed by changing deposition parameters. Once the trend is known, it is easy to dial-in a particular internal stress into the thin film. The thickness of the permeation barrier film structure deposited on the OLEDs is 4-6 μm. For a permeation barrier film several microns thick, it is extremely important to precisely control the internal stress. The built-in stress in films deposited by PE-CVD can be controlled by the deposition power, deposition pressure, overall gas flow rate, frequency of the RF discharge, distance between electrodes, temperature of the substrate during deposition, and annealing temperature after deposition.

The radius of curvature R of the device substrates (125 μm thick Kapton®-E polyimide substrate) before the hybrid permeation barrier film deposition is generally about 6.5 cm and after the deposition is reduced to about 2.5 cm, both in compressive direction. We believe that the final composite structure of OLED device on a substrate sealed with the hybrid permeation barrier film structure should not curve more than this radius in order to prevent delamination of the hybrid permeation barrier film structure from the OLED device during accelerated shelf-life temperature-humidity tests.

Using the Stoney equation (6) above, valid for compliant substrates, the approximate internal stress in a 1 μm thick hybrid permeation barrier film structure deposited on a 125 μm thick Kapton®-E polyimide substrate is calculated to be, $\sigma_i \sim -700$ MPa in the compressive direction. According to an embodiment of the present disclosure, it is desirable to limit the internal stress of the stacked hybrid permeation barrier structure to <1 GPa for a 1 μm thick stack.

Figure 5:
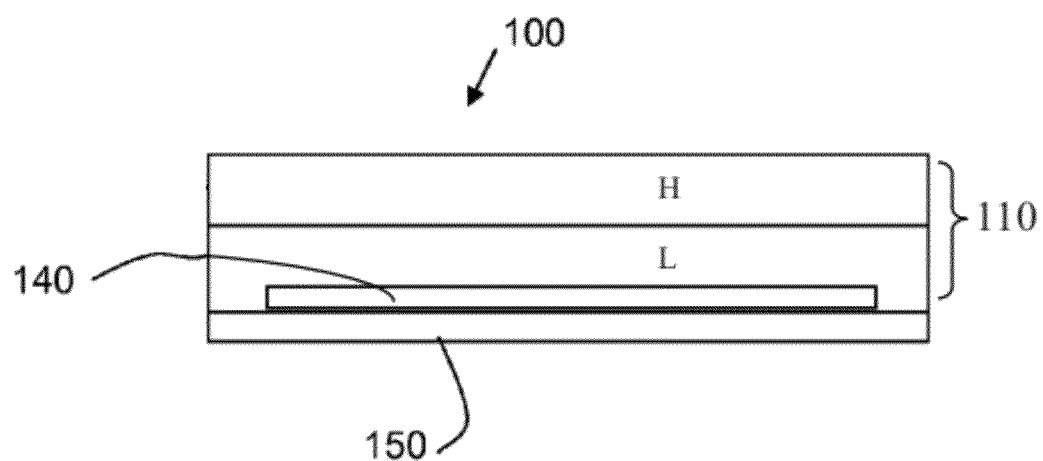
FIG. 5 shows a schematic cross-sectional view of a portion of an OLED encapsulated with the hybrid permeation barrier film structure according to an embodiment.

FIG. 5 shows a cross-sectional view of a portion of an organic electronic device 100, such as an OLED coated over with a hybrid permeation barrier film structure 110. The organic electronic device 100 comprises an OLED body 140 disposed on a substrate 150 in which the OLED body 140 is encapsulated with the hybrid permeation barrier film structure 110 having the hybrid permeation barrier composition according to the present disclosure. The hybrid permeation barrier film structure 110 is a bilayer stack comprised of a low etch-rate region L directly deposited on the OLED body 140 and a high etch-rate region H deposited on the low etch-rate region L.

Figure 6:
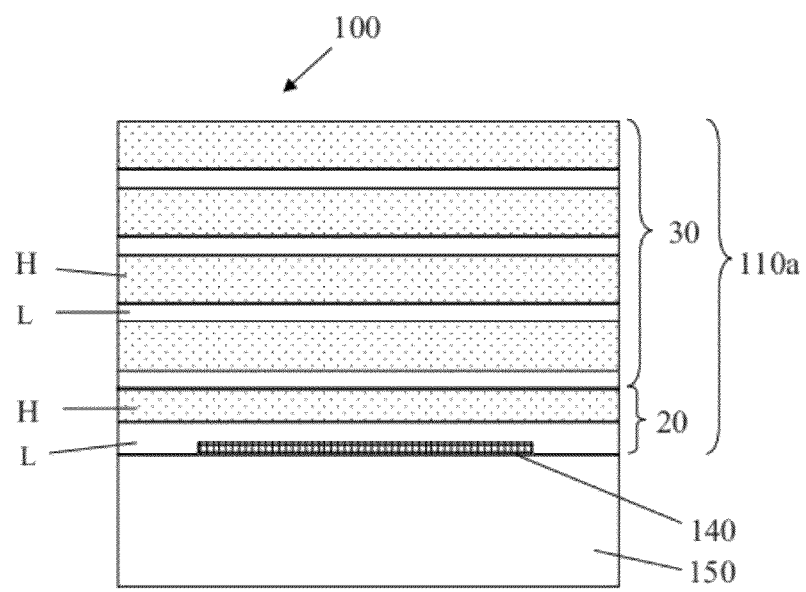
FIG. 6 shows a more detailed view of the structure of FIG. 5.

FIG. 6 shows a cross-sectional view of another embodiment of the organic electronic device 100 in which the hybrid permeation barrier film structure 110a comprises a plurality of bilayer stacks 20, 30 encapsulating the OLED body 140. The hybrid permeation barrier film structure 110a comprises a first bilayer stack 20 directly deposited on the OLED body 140 and can have one or more additional bilayer stacks 30 deposited on top of the first bilayer stack 20.

In the bilayer stacks shown in FIGS. 5 and 6, each of the bilayer stack is comprised of a low etch-rate region L having a composition corresponding to a first $CF_4$—$O_2$ Plasma Reactive Ion Etch Rate and a high etch-rate region H having a composition corresponding to a second $CF_4$—$O_2$ Plasma Reactive Ion Etch Rate. Preferably, the second $CF_4$—$O_2$ Plasma Reactive Ion Etch Rate is greater than the first $CF_4$—$O_2$ Plasma Reactive Ion Etch Rate by a factor of at least 1.2 and preferably between 1.2 to 5. According to one embodiment, the first $CF_4$—$O_2$ Plasma Reactive Ion Etch Rate is less than 65 nm/min and the second $CF_4$—$O_2$ Plasma Reactive Ion Etch Rate is greater than 80 nm/min. As used herein, the "$CF_4$—$O_2$ Plasma Reactive Ion Etch Rate" refers to the etch rate obtained using a $CF_4$—$O_2$ plasma reactive ion etch process that would etch thermally grown $SiO_2$ at the rate of 45 nm/min. The $CF_4$—$O_2$ Plasma Reactive Ion Etch Rates are used here as indicators for the relative densities of the thin film samples. Higher etch rate indicates lower density of the thin film. Thus, the low etch-rate region L has higher density than the high etch-rate region H.

As discussed above, the hybrid permeation barrier film structures 110, 110a have the hybrid permeation barrier composition which comprises a homogeneous mixture of a polymeric material and a non-polymeric material, wherein the mixture is created from a single precursor material. As described above, the low etch-rate region L and the high etch-rate region H are deposited using the PE-CVD process using a single precursor material. However, the process parameters are adjusted to achieve appropriate growth rates in order to produce appropriate densities for each of the two regions. The low etch-rate region L is deposited with lower growth rate than the high etch-rate region H so that the low etch-rate region L is formed by a layer of the hybrid permeation barrier film material having higher density than the high etch-rate region H. Because the two regions are deposited at different growth rates, it is expected that the stoichiometric ratios of the elemental compositions and, thus, the ratios of polymeric material to the non-polymeric material in each of the two regions L and H would be different. This, however, does not change the homogeneity of the mixture of the polymeric material and the non-polymeric material within each of the two regions L and H.

The low etch-rate region L can have a thickness between 5 nm to 1000 nm and preferably no less than 5 nm to provide sufficient bulk and function as an interface diffusion barrier. In the embodiment where the hybrid permeation barrier film structure 110 has one or more additional bilayer stacks 30 deposited on top of the first bilayer stack 20, the thickness of the low etch-rate region L in the first bilayer stack 20 can be between 250 nm to 1000 nm. In one preferred embodiment, the thickness of the low etch-rate region L in the first bilayer stack 20 is ~250 nm±5 nm. The thickness of ~250 nm±5 nm allows sufficient coverage of most particulate contaminants that might be present on the surface of the OLED device being encapsulated while ensuring that the built-in stress of the low etch-rate region L is not too high.

As discussed above, the built-in stress, or internal stress, for the low etch-rate region L can be high and the internal stress increases with the thickness of the film. And the thickness of the low etch-rate region L is preferably limited to minimize delamination of the low etch-rate region L from the underlying surface (electronic device and/or the substrate) during the life of the device. The inventors have found that for the permeation barrier film having the hybrid permeation barrier composition, the desired maximum thickness for the low etch-rate region L is ~1000 nm±10 nm.

According to an aspect of the present disclosure, although it is the low etch-rate region L that provides the primary permeation barrier function, by lowering the lateral interface diffusion, in order to attenuate the internal stress of the low etch-rate region L, the permeation barrier film structures 110, 110a may comprise a bilayer structure where a high etch-rate region H is paired with the low etch-rate region L. As shown in FIG. 6, the hybrid permeation barrier film structure 110a can have a stacked structure formed by one or more bilayer stacks 20, 30. The low etch-rate region L and the high etch-rate region H alternate within the stacked structure of the hybrid permeation barrier film structure 110.

In each of the bilayer stack, the ratio of the thickness of the high etch-rate region H to the low etch-rate region L can be 0.5 to 20. The thickness of the low etch-rate region L is at least 5 nm in order to ensure that the low etch-rate region L is sufficiently thick so that the protection against lateral interface diffusion is optimized. Referring to the embodiment of FIG. 6, in the additional bilayer stacks 30 provided above the first bilayer stack 20, however, the low etch-rate region L is kept to a minimum thickness while the high etch-rate region H is maximized for its internal stress attenuation function. In one embodiment, the ratio of the thickness of the high etch-rate region H to the low etch-rate region L in the additional bilayer stacks 30 is about 1 to 20 and preferably 5 to 20.

In one embodiment, the low etch-rate region L of the at least one additional bilayer stacks 30 has a thickness between 5 nm to 75 nm and preferably between 25 nm to 75 nm. In one embodiment, the high etch-rate region H has a thickness between 300 nm to 400 nm.

The low etch-rate region L and the high etch-rate region H within one bilayer stack structure (20 or 30) are deposited by a continuous PE-CVD deposition using one precursor material, an organo-silicon compound, in an oxygen-containing reactant gas without any interruption. After the deposition of the first bilayer stack 20 is completed, i.e. after about 400-500 nm of film, the substrate is cooled down to prevent any thermal damage to the device 140. After the substrate cools down, next of the one or more bilayer stacks 30 is deposited starting with the low etch-rate region L (25-75 nm) followed by a thicker high etch-rate region H (300-400 nm). The provision of the thinner low etch-rate region L in the subsequent bilayer stacks 30 provides mechanical stability and prevents delamination between each of the bilayer stacks.

Although the two regions L and H are deposited in one PE-CVD process chamber in a continuous process using one precursor material, the high etch-rate region H is deposited using higher growth rate than the low etch-rate region L. The desired film growth rate is achieved by adjusting the PE-CVD parameters. Table 4 below shows an example of the PE-CVD process recipe that was used to make the low etch-rate region L and high etch-rate region H. The low etch-rate region L is deposited using lower flow rates of HMDSO and $O_2$ and shorter electrode distance. On the other hand, the high etch-rate region H is deposited using higher flow rates of HMDSO and $O_2$ and longer electrode distance. Reduction in the gas flow rates contributes to reduction in the film growth rate and results in higher film density, as mentioned above. Also, smaller electrode distance increases the density of the plasma which also helps in increasing the film density. Converse is true for the high etch-rate region H. As can be seen in the right most column in Table 4, the $CF_4$—$O_2$ Plasma Reactive Ion Etch Rate of region L is closer to that of the thermally grown $SiO_2$ film (45 nm/min) and the $CF_4$—$O_2$ Plasma Reactive Ion Etch Rate of region H is higher than either. As discussed above, while the low etch-rate region L needs to be provided at some minimum thickness to provide sufficient bulk and function as an interface diffusion barrier, it is desirable to limit the thickness of the low etch-rate region L in order to minimize delamination of the low etch-rate region L from the underlying surface. Therefore, the transition between the two PE-CVD process parameters shown in Table 4 is made quickly so that the thicknesses of the two regions L and H can be controlled fairly accurately. This results in the transition of the composition of the low etch-rate region L to the composition of the high etch-rate region H to be abrupt and distinct, wherein the compositions of the regions L and H correspond to their respective $CF_4$—$O_2$ Plasma Reactive Ion Etch Rates.

TABLE 4

Recipe for higher density region and lower density regions.

| Layer | RF Power (W) | HMDSO flow rate (sccm) | Oxygen flow rate (sccm) | Pressure (Pa) | Electrode distance (mm) | RIE Rate (nm/min) |
|---|---|---|---|---|---|---|
| Low etch-rate (Higher density) region L | 338 | 5 | 160 | 16.6 | 15 | 48.6 |
| High etch-rate (Lower density) region H | 338 | 9 | 290 | 15 | 20 | 97.4 |

"RIE Rate" is the $CF_4$—$O_2$ Plasma Reactive Ion Etch Rate.

Increasing the deposition RF power results in increased density of energetic electrons and increased bombardment of electrodes by ions. With increase in power, at constant pressure and gas feed rates, the growth rate increases leveling off at high power. Further increase in power might result in enhanced ablation of film by ions causing the growth rate to decrease. High deposition power promotes monomer fragmentation and increases the oxidation of activated species making the films more $SiO_2$-like. Starting from a low flow rate, at a given deposition power and pressure, the initial increase in the feed rate of HMDSO and $O_2$ (constant gas flow ratio) increases the growth rate resulting in the high etch-rate (lower density) region. But if the gas flow rates were increased further, the growth rate decreases because of small residence time of activated species in the reactor. A composite parameter W/FM is used to monitor the deposition process, where, W is the deposition power, F is the gas flow rate and M is the molar mass. Increase in W/FM increases the deposition rate in monomer sufficient or energy deficient region. With further increase in the parameter, the growth rate levels off and then eventually decreases in monomer the deficient region. In the monomer sufficient region, there is limited fragmentation of monomer and hence increasing the W/FM parameter increases the fraction of activated monomers increasing the growth rate. Upon further increase in the parameter, the ablation by bombarding ions becomes more active saturating the growth, and eventually, when the energy of bombarding ions becomes too high, the growth rate falls off. The position of the substrate affects the growth and deposition of plasma polymerized films because of heterogeneity of concentration of monomer and active species in the reactor. If the inter-electrode distance is too large, at a given applied potential the electric field between the electrodes will be too weak to impart sufficient energy to electrons preventing efficient fragmentation of monomer molecules. Further details on the effect of process parameters on film growth rate can be obtained from the PhD thesis of Prashant Mandlik, "A Novel Hybrid Inorganic-Organic Single Later Barrier for Organic Light-Emitting Diodes", Electrical Engineering Department, Princeton University.

Figure 7:
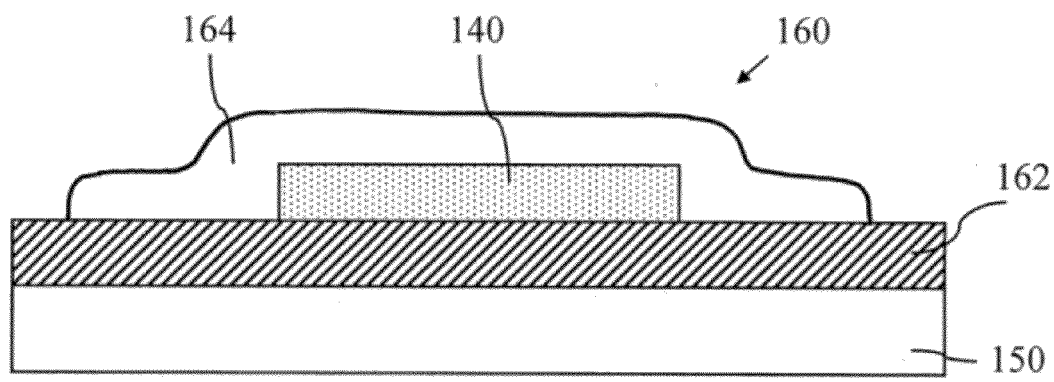
FIG. 7 shows a schematic cross-sectional view of an encapsulated OLED according to another embodiment.

According to another aspect of the present disclosure, the stacked hybrid permeation barrier film structure may serve as the surface upon which an electronic device is disposed, the cover for the electronic device, or both. FIG. 7 shows an example of such a structure. A stacked hybrid permeation barrier layer structure 162 according to the present disclosure is deposited on a substrate 150. An electronic device 140, such as an OLED body (including the electrodes), is disposed on the surface of the stacked hybrid permeation barrier layer structure 162. Another stacked hybrid permeation barrier layer structure 164 is then deposited over the electronic device 140 to cover it. The second stacked hybrid permeation barrier layer structure 164 is deposited over the electronic device 140 as a conformal coating. As such, in addition to covering the top of the electronic device 140, the permeation barrier structure also extends down the sides of the device 140 and contacts the surface of the first stacked hybrid permeation barrier layer structure 162. In this way, the electronic device 140 is sealed between the two hybrid permeation barrier layer structures 162, 164. The hybrid permeation barrier layer structures 162, 164 have the same structure as the hybrid permeation barrier layer structure 110 embodiment described above.

The embodiments described in the foregoing disclosure are presented as examples. The scope of the present invention is to be limited only by the following claims.

What is claimed is:

1. A permeation barrier film structure for encapsulating an organic light emitting device, the permeation barrier film structure comprising:
   a bilayer stack having a hybrid permeation barrier composition that comprises a homogeneous mixture of a polymeric material and a non-polymeric material, the bilayer stack comprising:
      a first region directly deposited on the organic light emitting device, wherein the first region having a first composition that is a homogeneous mixture of a polymeric material and a non-polymeric material and having a first $CF_4$—$O_2$ Plasma Reactive Ion Etch Rate; and
      a second region deposited on the first region, wherein the second region having a second composition that is a homogeneous mixture of said polymeric material and said non-polymeric material and having a second $CF_4$—$O_2$ Plasma Reactive Ion Etch Rate, wherein the second $CF_4$—$O_2$ Plasma Reactive Ion Etch Rate is greater than the first $CF_4$—$O_2$ Plasma Reactive Ion Etch Rate by a factor greater than 1.2, wherein the first region having a maximum thickness of 1000 nm ±10 nm.

2. The permeation barrier film structure of claim 1, wherein the second $CF_4$—$O_2$ Plasma Reactive Ion Etch Rate is greater than the first $CF_4$—$O_2$ Plasma Reactive Ion Etch Rate by a factor between 1.2 to 5.

3. The permeation barrier film structure of claim 1, wherein the ratio of the thickness of the second region to the first region is between 0.5 to 20.

4. The permeation barrier film structure of claim 1, wherein the hybrid permeation barrier composition comprises a homogeneous mixture of a polymeric material and a non-polymeric material, wherein the first region and the second region are created from a single precursor material.

5. The permeation barrier film structure of claim 4, wherein the polymeric material is silicone and the non-polymeric material comprises one or more silicon oxides, wherein the first region and the second region are deposited by plasma enhanced chemical vapor deposition of an organo-silicon compound in oxygen-containing reactant gas.

6. The permeation barrier film structure of claim 5, wherein the silicon oxides comprise one or more of SiO, $SiO_2$, and mixed-valence oxides $SiO_x$.

7. The permeation barrier film structure of claim 5, wherein the organo-silicon compound is a siloxane.

8. The permeation barrier film structure of claim 7, wherein the siloxane compound is one of Hexamethyl disiloxane or dimethyl siloxane.

9. The permeation barrier film structure of claim 4, wherein the polymeric material is silicone and the non-polymeric material is silicon nitride, wherein the first region and the second region are deposited by plasma enhanced chemical vapor deposition of an organo-silicon compound in nitrogen-containing reactant gas.

10. The permeation barrier film structure of claim 9, wherein the organo-silicon compound is a siloxane.

11. The permeation barrier film structure of claim 10, wherein the siloxane compound is one of Hexamethyl disiloxane or dimethyl siloxane.

12. The permeation barrier film structure of claim 1, wherein the first $CF_4$—$O_2$ Plasma Reactive Ion Etch Rate is less than 65 nm/min and the second $CF_4$—$O_2$ Plasma Reactive Ion Etch Rate is greater than 80 nm/min.

13. An electronic device comprising an organic light emitting device provided on a substrate, the electronic device comprising:
   a permeation barrier film structure coated over the organic light emitting device, said permeation barrier film structure comprising:
   one or more bilayer stacks with a first of the one or more bilayer stacks directly deposited on the organic light emitting device, wherein each of said bilayer stacks has a hybrid permeation barrier composition that comprises a homogeneous mixture of a polymeric material and a non-polymeric material, wherein said first bilayer stack comprising:
      a first region directly deposited on the organic light emitting device, wherein the first region having a first composition that is a homogeneous mixture of a polymeric material and a non-polymeric material, and having a first $CF_4$—$O_2$ Plasma Reactive Ion Etch Rate that is directly deposited on the organic light emitting device; and
      a second region deposited on the first region, wherein the second region having a second composition that is a homogeneous mixture of said polymeric material and said non-polymeric material, and having a second $CF_4$—$O_2$ Plasma Reactive Ion Etch Rate, that is deposited on the first region; wherein the second $CF_4$—$O_2$ Plasma Reactive Ion Etch Rate is greater than the first $CF_4$—$O_2$ Plasma Reactive Ion Etch Rate by a factor greater than 1.2, wherein the first region having a maximum thickness of 1000 nm ±10 nm.

14. The electronic device of claim 13, wherein the second $CF_4$—$O_2$ Plasma Reactive Ion Etch Rate is greater than the first $CF_4$—$O_2$ Plasma Reactive Ion Etch Rate by a factor between 1.2 to 5.

15. The electronic device of claim 13, wherein the ratio of the thickness of the second region to the first region is between 0.5 to 20.

16. The electronic device of claim 13, wherein the hybrid permeation barrier composition comprises a homogeneous mixture of a polymeric material and a non-polymeric material, wherein the first region and the second region are created from a single precursor material.

17. The electronic device of claim 16, wherein the polymeric material is silicone and the non-polymeric material is one or more silicon oxides.

18. The electronic device of claim 17, wherein the silicon oxides comprise one or more of SiO, $SiO_2$, and mixed-valence oxides $SiO_x$.

19. The electronic device of claim 17, wherein the organo-silicon compound is a siloxane.

20. The electronic device of claim 19, wherein the siloxane compound is one of Hexamethyl disiloxane or dimethyl siloxane.

21. The electronic device of claim 16, wherein the polymeric material is silicone and the non-polymeric material is silicon nitride.

22. The electronic device of claim 21, wherein the organo-silicon compound is a siloxane.

23. The electronic device of claim 22, wherein the siloxane compound is one of Hexamethyl disiloxane or dimethyl siloxane.

24. The electronic device of claim 13, further comprising an electrode layer in direct contact with the permeation barrier film structure, wherein the electrode layer is a sputtered metal film.

25. The electronic device of claim 13, further comprising another permeation barrier film structure provided between the organic light emitting device and the substrate, wherein said another permeation barrier film structure comprising:
   another bilayer stack comprising:
      a third region having said first composition that is a homogeneous mixture of said polymeric material and said non-polymeric material, and having said first $CF_4$—$O_2$ Plasma Reactive Ion Etch Rate, said third region being directly deposited on the substrate; and
      a fourth region having said second composition that is a homogeneous mixture of said polymeric material and said non-polymeric material, and having said second $CF_4$—$O_2$ Plasma Reactive Ion Etch Rate, said fourth region being deposited on the third region.

26. The electronic device of claim 25, wherein the third region having a maximum thickness of 1000 nm ±10 nm.

* * * * *

UNITED STATES PATENT AND TRADEMARK OFFICE
CERTIFICATE OF CORRECTION

PATENT NO. : 8,766,240 B2  Page 1 of 1
APPLICATION NO. : 12/886994
DATED : July 1, 2014
INVENTOR(S) : Prashant Mandlik, Jeffrey Silvernail and Ruiqing Ma It is certified that error appears in the above-identified patent and that said Letters Patent is hereby corrected as shown below:

In the Specification

Column 1, line 21, insert:

-- GOVERNMENT RIGHTS
This invention was made with U.S. Government support under Contract No. IIP-0948093 awarded by U.S. National Science Foundation. The government has certain rights in this invention. --

Signed and Sealed this
Ninth Day of December, 2014

Michelle K. Lee
*Deputy Director of the United States Patent and Trademark Office*